(12) United States Patent
Jeong et al.

(10) Patent No.: US 9,203,050 B2
(45) Date of Patent: Dec. 1, 2015

(54) ORGANIC LIGHT EMITTING DIODE DISPLAY AND METHOD OF MANUFACTURING THE SAME

(71) Applicant: Samsung Display Co., Ltd., Yongin, Gyeonggi-Do (KR)

(72) Inventors: Chul Woo Jeong, Hwaseong-si (KR); Soon Ryong Park, Sejong-si (KR); Jung Ho So, Cheonan-si (KR); Seok Gi Baek, Yongin-si (KR); Kwang Hyeok Kim, Anyang-si (KR); Jeong Yong Eom, Icheon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/221,128

(22) Filed: Mar. 20, 2014

(65) Prior Publication Data
US 2014/0346474 A1   Nov. 27, 2014

(30) Foreign Application Priority Data

May 21, 2013  (KR) .................. 10-2013-0057249
Sep. 5, 2013  (KR) .................. 10-2013-0106747

(51) Int. Cl.
*H01L 35/24*   (2006.01)
*H01L 51/52*   (2006.01)
*H01L 27/32*   (2006.01)
*H01L 51/56*   (2006.01)

(52) U.S. Cl.
CPC ............ *H01L 51/5253* (2013.01); *H01L 27/32* (2013.01); *H01L 51/524* (2013.01); *H01L 51/5237* (2013.01); *H01L 51/56* (2013.01); *H01L 2251/5338* (2013.01)

(58) Field of Classification Search
CPC .................................................. H01L 51/5253
USPC ............................................ 257/40, E51.001
See application file for complete search history.

(56) References Cited

U.S. PATENT DOCUMENTS

2008/0042940 A1   2/2008  Hasegawa
2012/0262660 A1   10/2012 Fujiwara et al.

FOREIGN PATENT DOCUMENTS

| EP | 2133854 A1 | 12/2009 |
|---|---|---|
| JP | 2009-170173 A | 7/2009 |
| JP | 2012-243578 | 12/2012 |
| KR | 10-2008-0061489 A | 7/2008 |
| KR | 10-2008-0061824 A | 7/2008 |

(Continued)

OTHER PUBLICATIONS

Machine Translation of KR 10-2008-0061489.*

(Continued)

*Primary Examiner* — Anthony Ho
(74) *Attorney, Agent, or Firm* — Innovation Counsel LLP

(57) ABSTRACT

Disclosed is an organic light emitting diode display including an organic light emitting display panel configured to display an image, and a lower passivation film attached to a bottom of the organic light emitting diode display panel. The lower passivation film includes a support film that is in contact with the organic light emitting diode display panel, and a stress adjustment layer formed beneath the support film and configured to reduce a bending stress to be induced in the organic light emitting display panel when the organic light emitting display panel and the lower passivation film are bent.

17 Claims, 12 Drawing Sheets

(56) References Cited

FOREIGN PATENT DOCUMENTS

| KR | 10-0967362 | 6/2010 |
| KR | 10-1113661 | 2/2012 |
| KR | 10-2012-0112846 | 10/2012 |
| WO | 2010/005064 A1 | 1/2010 |
| WO | 2011-096350 A1 | 8/2011 |

OTHER PUBLICATIONS

Machine Translation of KR 10-2011-0105751.*
Extended European Search Report, Application No. 14168752.5, mailed on Feb. 20, 2015.

* cited by examiner

ORGANIC LIGHT EMITTING DIODE DISPLAY AND METHOD OF MANUFACTURING THE SAME

CROSS-REFERENCE TO RELATED APPLICATION

This application claims priority to, and the benefit of, Korean Patent Application Nos. 10-2013-0106747 and 10-2013-0057249 filed in the Korean Intellectual Property Office on Sep. 5, 2013 and May 21, 2013 respectively, the entire contents of each of which are incorporated herein by reference.

BACKGROUND OF THE INVENTION (a) Field of the Invention

Embodiments of the present invention relate generally to flat panel displays. More specifically, embodiments of the present invention relate to an organic light emitting diode display and a method of manufacturing the same.

(b) Description of the Related Art

An organic light emitting diode display includes organic light emitting elements that each have a hole injection electrode, an organic light emitting layer, and an electron injection electrode. Each organic light emitting element emits light due to energy generated when an exciton generated by combining electrons and holes in the organic light emitting layer falls from an exited state to a lower state.

Since the organic light emitting element may deteriorate due to external factors such as external moisture, oxygen, or ultraviolet (UV) rays, it is desirable to seal the organic light emitting element. Further, it is often desirable for the organic light emitting diode display to have a small thickness or be easily bent, in order to apply the organic light emitting element to various applications. A thin film encapsulation (TFE) technology has seen recent use in the development of thin sealed organic light emitting diode displays. The thin film encapsulation technology often entails alternately laminating one or more inorganic layers and organic layers on the organic light emitting elements formed in a display region of a display substrate, to cover the display region with a thin film encapsulation layer. When the display substrate of the organic light emitting diode display having the thin film encapsulation layer is formed of a flexible film such as polyimide (PI), the display substrate is easily bent and useful for a reduction in thickness.

When the flexible organic light emitting diode display is bent, stress occurs. Specifically, tensile stress occurs toward the convex outer surface and compressive stress occurs toward the concave inner surface. A neutral plane NP at which no stresses are present occurs in an intermediate region between the inner and outer surfaces. Only when the organic light emitting element is positioned in the neutral plane are picture abnormalities avoided in the organic light emitting diode display.

However, when the thickness of the organic light emitting diode display is increased by internal and external films such as a polarizing film and a passivation film attached to the organic light emitting diode display, the tensile stress and the compressive stress are increased and the neutral plane becomes displaced. Accordingly, it is difficult to position the organic light emitting element in the neutral plane. Further, since the organic light emitting diode display has a layered structure made of complex materials, asymmetry of strains occurs due to a difference in tensile stress and compressive stress at the inner and outer surfaces of a bent bending portion. Accordingly, it is difficult to position the organic light emitting element in the neutral plane, thus giving rise to picture abnormalities.

The above information disclosed in this Background section is only for enhancement of understanding of the background of the invention, and therefore it may contain information that does not form the prior art that is already known in this country to a person of ordinary skill in the art.

SUMMARY OF THE INVENTION

Embodiments of the present invention provide an organic light emitting diode display selectively adjusting a strain of a bent portion to reduce stress in the bent portion, as well as a method of manufacturing the same.

An exemplary embodiment of the present invention provides an organic light emitting diode display including an organic light emitting display panel configured to display an image. A lower passivation film is attached to a bottom of the organic light emitting diode display panel. The lower passivation film includes a support film that is in contact with the organic light emitting diode display panel. A stress adjustment layer is formed beneath the support film and configured to reduce a bending stress to be induced in the organic light emitting display panel when the organic light emitting display panel and the lower passivation film are bent.

The stress adjustment layer may include a plurality of stress adjustment patterns disposed adjacent to each other.

The stress adjustment patterns may have any one selected from a triangular shape, a trapezoidal shape, and a semicircular shape.

Lower ends of adjacent stress adjustment patterns may be directly connected or spaced apart from each other.

The organic light emitting diode display panel may include a flat portion and bent portions positioned at ends of the flat portion.

The stress adjustment patterns may include first stress adjustment patterns positioned corresponding to the flat portion and second stress adjustment patterns corresponding to the bent portions. An interval between the second stress adjustment patterns may be smaller than an interval between the first stress adjustment patterns.

The interval between the first stress adjustment patterns and the interval between the second stress adjustment patterns may intervals between central axes of upper ends of the first and second stress adjustment patterns, respectively.

The lower passivation film may further include a plane passivation layer formed beneath the support film and adjacent to the stress adjustment layer.

The plane passivation layer may be positioned to correspond to the flat portion.

The organic light emitting diode display panel may include a flexible substrate attached to a top of the lower passivation film. An organic light emitting element may be formed on the flexible substrate. A thin film encapsulation layer may cover the organic light emitting element.

Another exemplary embodiment of the present invention provides a method of manufacturing an organic light emitting diode display. The method includes fabricating a lower passivation film including a support film, a stress adjustment layer formed beneath the support film, and a release film covering the stress adjustment layer; attaching the lower passivation film to a bottom of a flexible substrate; sequentially forming an organic light emitting element and a thin film encapsulation layer on the flexible substrate; separating the release film from the lower passivation film to expose the stress adjustment layer; and forming a bent portion of the organic light emitting diode display panel by bending a portion of the organic light emitting diode display panel.

In the forming a bent portion, a first interval between stress adjustment patterns positioned corresponding to the bent portion may be smaller than a second interval between stress adjustment patterns positioned corresponding to a flat portion of the organic light emitting diode display panel.

The stress adjustment patterns may have any one selected from a triangular shape, a trapezoidal shape, and a semicircular shape.

The first interval or the second interval may be an interval between central axes of upper ends of adjacent stress adjustment patterns.

An OLED display according to an exemplary embodiment of the present invention includes an organic light emitting display panel configured to display an image, and a lower passivation film attached to a bottom of the organic light emitting diode display panel. The lower passivation film includes a support film contacting the organic light emitting diode display panel and a stress adjustment layer formed beneath the support film, where the stress adjustment layer includes a plurality of unit stress adjustment patterns, each having a quadrilateral base and arranged adjacent to each other. The unit stress adjustment patterns each include four stress adjustment patterns positioned adjacent to each other and having pyramidal shapes.

The four stress adjustment patters of each unit stress adjustment pattern may intersect at a common point. The unit stress adjustment patterns may be arranged in repeating manner along each of a horizontal direction, a vertical direction, and a diagonal direction.

Bottom edges of two unit stress adjustment patterns positioned adjacent to each other along a diagonal direction may be connected to each other.

According to the exemplary embodiments of the present invention, in an organic light emitting diode display, it is possible to selectively minimize stress in bent portions of an organic light emitting display panel by reducing an interval between stress adjustment patterns positioned corresponding to bent portions of the organic light emitting diode display panel. Therefore, asymmetry of strains of the bending portions of the organic light emitting diode display panel can be prevented to remove or reduce a picture abnormality.

Further, a stress adjustment layer is covered with a release film to flatten the lower passivation film before the stress adjustment layer of the lower passivation film is exposed. Thereby, it is possible to prevent a reduction in recognition ratio of an align mark due to optical scattering by the stress adjustment patterns of a lower passivation film during a manufacturing process.

Further, when a chip on film (COF) is pressed onto the organic light emitting diode display panel while the stress adjustment layer of the lower passivation film is exposed, a reduction in pressing force may increase a frequency of occurrence of pressing defects. However, it is possible to prevent a reduction in pressing force and thus reduce a frequency of occurrence of pressing defects by pressing the chip on film (COF) onto the organic light emitting diode display panel while the stress adjustment layer is covered with the release film to flatten the lower passivation film. In addition, since a stress adjustment layer having triangular pyramid-shaped stress adjustment patterns is formed, the organic light emitting diode display panel can be easily bent along a horizontal direction, a vertical direction, and a diagonal direction so that stress generated in the organic light emitting diode display panel when the organic light emitting diode display panel is being bent can be minimized.

DETAILED DESCRIPTION OF THE EMBODIMENTS

Figure 1:
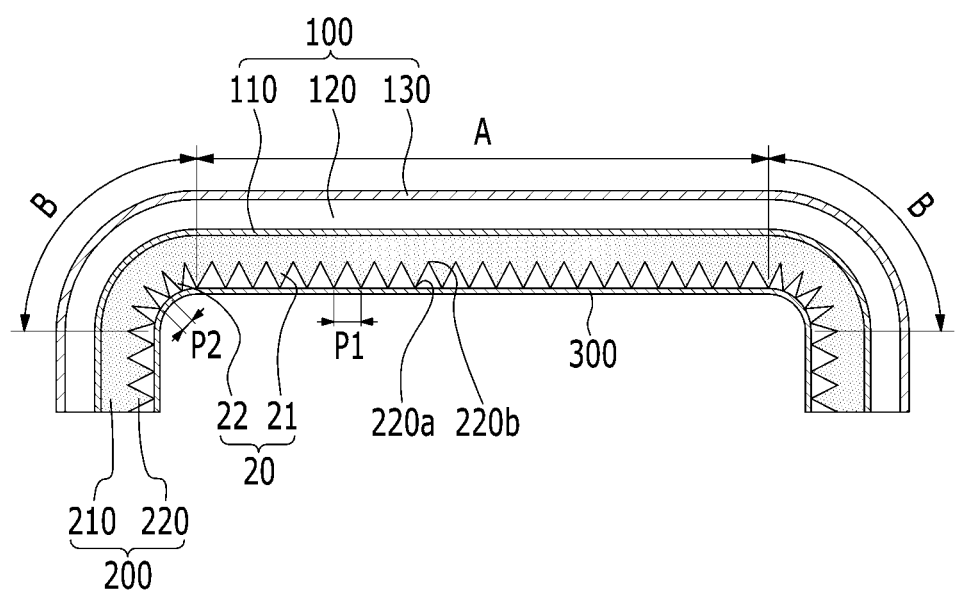
FIG. 1 is a lateral view of an organic light emitting diode display according to a first exemplary embodiment of the present invention.

Hereinafter, exemplary embodiments of the present invention will be described in detail with reference to the accompanying drawings so that those skilled in the art may easily practice the present invention. As those skilled in the art would realize, the described embodiments may be modified in various different ways, all without departing from the spirit or scope of the present invention.

In describing the present invention, parts that are not related to the description will be omitted. Like reference numerals generally designate like elements throughout the specification.

In addition, the size and thickness of each element shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. The figures are thus not to scale. It will be understood that when an element such as a layer, film, region, or substrate is referred to as being "on" another element, it may be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "~on" means positioning on or below the object portion, but does not essentially mean positioning on the upper side of the object portion based on a gravity direction.

In addition, in the accompanying drawings, an active matrix (AM) type organic light emitting diode display that has a 2Tr-1Cap structure including one pixel, two thin film transistors (TFT), and one capacitor is shown, but the present invention is not limited thereto. Accordingly, the organic light emitting diode display may include one pixel, a plurality of thin film transistors, and one or more capacitors, and a separate wire may be further formed or a known wire may be omitted to provide various structures. Here, the pixel means a minimum unit displaying an image, and the organic light emitting diode display displays the image through a plurality of pixels.

An organic light emitting diode display according to a first exemplary embodiment of the present invention will now be described in detail with reference to FIGS. 1 and 2.

FIG. 1 is a lateral view of an organic light emitting diode display according to a first exemplary embodiment of the present invention. FIG. 2 is an equivalent circuit of one pixel of an organic light emitting element of the organic light emitting diode display according to the first exemplary embodiment of the present invention.

As shown in FIG. 1, the organic light emitting diode display according to the first exemplary embodiment of the present invention includes an organic light emitting display panel 100 displaying an image, and a lower passivation film 200 attached to a bottom of the organic light emitting diode display panel 100.

The organic light emitting diode display panel 100 includes a flexible substrate 110, an organic light emitting element 120 formed on the flexible substrate 110, and a thin film encapsulation layer 130 covering the organic light emitting element 120. The organic light emitting diode display panel 100 may be divided into a flat or planar portion A, and curved or bent portions B positioned at both ends of the plane portion A.

The flexible substrate 110 may be formed of a flexible film such as polyimide.

Figure 2:
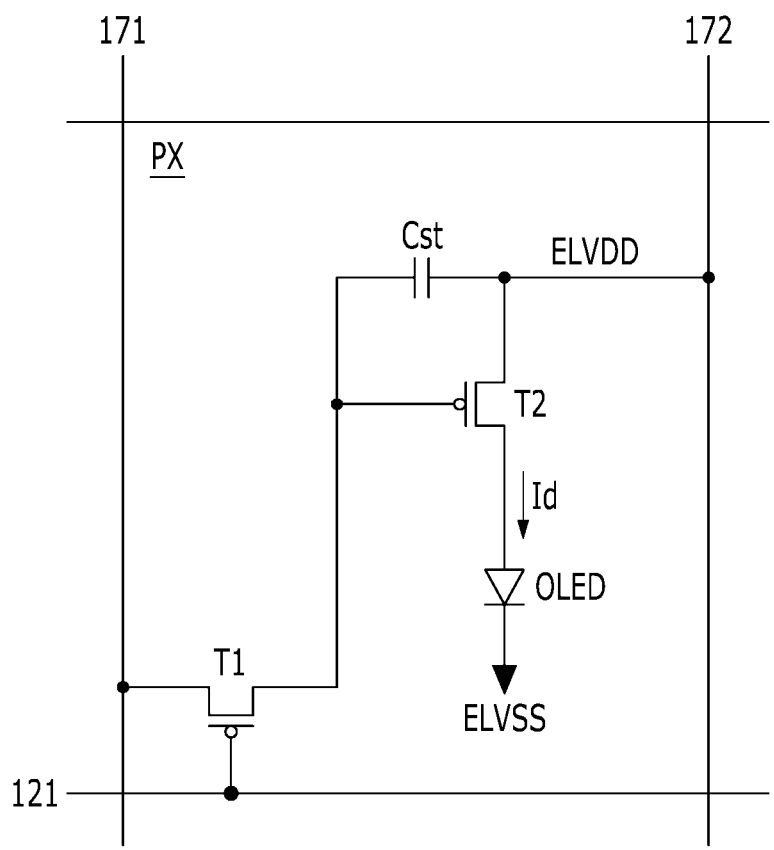
FIG. 2 is an equivalent circuit of one pixel of the organic light emitting diode display according to the first exemplary embodiment of the present invention.

As shown in FIG. 2, the organic light emitting element 120 includes a plurality of signal lines 121, 171, and 172, as well as a plurality of pixels PX connected thereto and arranged in an approximate matrix form.

The signal lines include a plurality of scan lines 121 transferring a scan signal (or gate signal), a plurality of data lines 171 transferring a data signal, and a plurality of driving voltage lines 172 transferring a driving voltage ELVDD. The scan lines 121 extend in an approximate row direction and are substantially parallel to each other. The data lines 171 and the driving voltage lines 172 extend in an approximate column direction and are substantially parallel to each other. Each pixel PX includes a switching thin film transistor T1, a driving thin film transistor T2, a storage capacitor Cst, and an organic light emitting diode (OLED).

The switching thin film transistor T1 has a control terminal, an input terminal, and an output terminal. The control terminal is connected to the scan line 121, the input terminal is connected to the data line 171, and the output terminal is connected to the driving thin film transistor T2. The switching thin film transistor T1 is responsive to the scan signal applied to the scan line 121 to transfer the data signal applied to the data line 171 to the driving thin film transistor T2.

Further, the driving thin film transistor T2 has a control terminal, input terminal, and output terminal. The control terminal is connected to the switching thin film transistor T1, the input terminal is connected to the output of the switching thin film transistor T1 and to the control terminal of transistor T3, and the output terminal is connected to the organic light emitting diode (OLED). The driving thin film transistor T2 allows an output current Id having a level varying according to a voltage applied between the control terminal and the output terminal to flow.

The storage capacitor Cst is connected between the control terminal and the input terminal of the driving thin film transistor T2. This storage capacitor Cst charges the data signal applied to the control terminal of the driving thin film transistor T2 and maintains the data signal even after the switching thin film transistor T1 is turned-off.

The organic light emitting diode (OLED) has an anode connected to the output terminal of the driving thin film transistor T2, a cathode connected to a common voltage ELVSS, and an organic light emitting member formed between the anode and the cathode. The organic light emitting diode (OLED) displays an image by emitting light while the intensity is changed according to the output current Id of the driving thin film transistor T2.

The switching thin film transistor T1 and the driving thin film transistor T2 may each be an n channel field effect transistor (FET) or a p channel field effect transistor. In addition, a connection relationship of the thin film transistors T1 and T2, the capacitor Cst, and the organic light emitting diode (OLED) may be changed. Embodiments of the invention contemplate any structure and equivalent circuit for pixel PX, besides that shown in FIG. 2.

Meanwhile, the thin film encapsulation layer 130 covering the organic light emitting element 120 may prevent oxygen and moisture from the outside from flowing or diffusing into the organic light emitting element 120, thus protecting the organic light emitting element 120.

The lower passivation film 200 includes a support film 210 that is in contact with the flexible substrate 110 of the organic light emitting diode display panel 100, and a stress adjustment layer 220 formed beneath the support film 210.

The stress adjustment layer 220 includes a plurality of stress adjustment patterns 20 disposed to be adjacent to each other. The stress adjustment patterns 20 include planar stress adjustment patterns 21 formed at a position corresponding to the planar portion A, and bent stress adjustment patterns 22 formed at a position corresponding to the bent portions B.

An interval between the stress adjustment patterns 20 may be adjusted to adjust a strain of the organic light emitting diode display panel 100, thereby reducing stress of the bending portions B. That is, a bent interval P2 between the bending stress adjustment patterns 22 is formed to be smaller than a planar interval P1 between the planar stress adjustment patterns 21.

Specifically, the planar interval P1 or the bent interval P2 is an interval between central axes 220a of upper ends (e.g., points, tips, or apexes) of the stress adjustment patterns 20. The stress adjustment patterns of the organic light emitting diode display according to the first exemplary embodiment of the present invention have a prism shape as shown in FIG. 1. Accordingly, a cross-section thereof may have a triangular or other polygonal shape, and adjacent lower ends 220b of the stress adjustment patterns 20 having the triangle shape are directly connected to each other (i.e. no space exists between adjacent patterns 20). The interval between the stress adjustment patterns 20 having the triangle shape is an interval between adjacent apexes 220a.

As described above, stress of the bending portions of the organic light emitting diode display panel may be minimized by reducing the bent interval P2 between the bending stress adjustment patterns 22 attached to a position corresponding to the bent portions B of the organic light emitting diode display panel 100. Therefore, asymmetry of strains of the bent portions of the organic light emitting diode display panel may be prevented to remove or prevent picture abnormalities. That is, the widths of patterns 22 in bent portion B can be adjusted so as to reduce or eliminate bending strain that would be induced in portion B when it is bent.

The lower passivation film 200 may include any material selected from UV epoxys, urethane acrylates, acrylates, or the like.

As described above, the lower passivation film 200 having the stress adjustment layer 220 may be attached to a bottom of the organic light emitting diode display panel 100 to prevent physical damage to the flexible substrate 110 of the organic light emitting diode display panel 100 and to minimize stress in the bent portions B of the organic light emitting diode display panel 100. Accordingly, asymmetry of strains of the bent portions B may be prevented, so as to remove picture abnormalities.

Meanwhile, a shape change prevention layer 300 for preventing a shape change of the stress adjustment layer 220 may be attached to a bottom of the lower passivation film 200.

Figure 3:
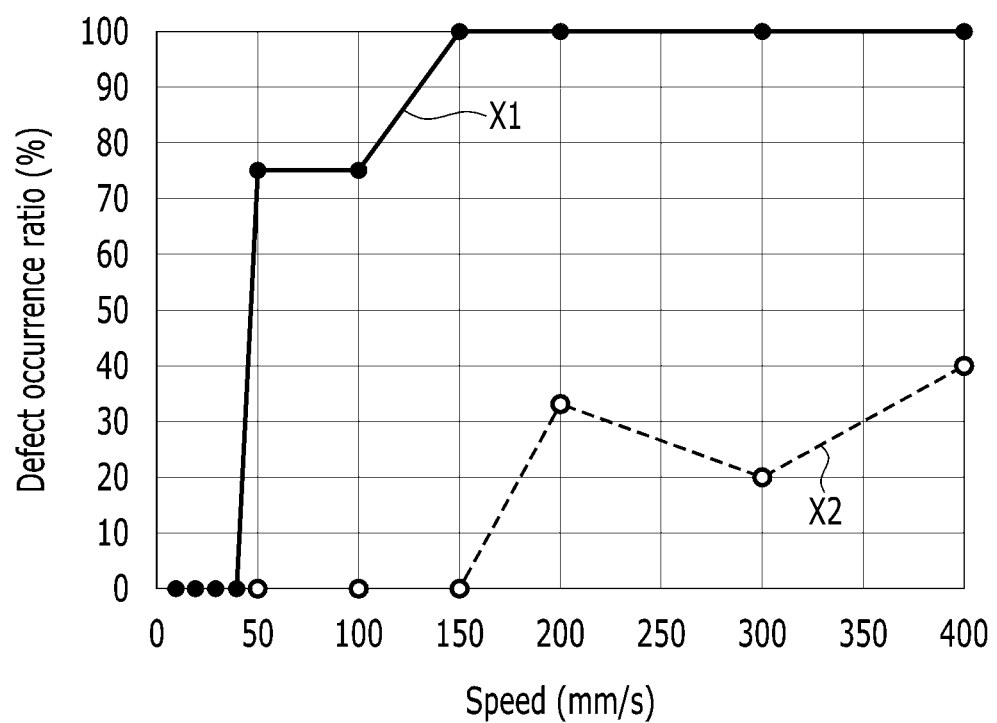
FIG. 3 is a graph of a defect occurrence ratio according to a bending speed of the organic light emitting diode display according to the first exemplary embodiment of the present invention and a known organic light emitting diode display.

FIG. 3 is a graph of a defect occurrence ratio according to a bending speed of the organic light emitting diode display according to the first exemplary embodiment of the present invention and according to a known conventional organic light emitting diode display.

The defect occurrence ratio of FIG. 3 refers to a ratio of probability of occurrence of an image quality defect when ten organic light emitting diode displays are bent to have a curvature radius of 3 mm. When the ten organic light emitting diode displays are bent and abnormality occurs in one organic light emitting diode display, the defect occurrence ratio has a value of 10%. The speed of FIG. 3 refers to the rate of bending of the organic light emitting diode display. When the organic light emitting diode display is more rapidly bent, larger force is applied to damage the organic light emitting diode display.

As shown in FIG. 3, it can be seen that in the conventional organic light emitting diode display X1, as the bending speed is increased, the defect occurrence ratio rapidly increases, and a 100% defect rate occurs at a speed of 150 mm/s or more. However, it can be seen that in the organic light emitting diode display X2 according to the first exemplary embodiment of the present invention, even when the bending speed is 150 mm/s or more, the defect occurrence ratio of 40% or less is maintained. As described above, it can be seen that even though the organic light emitting diode display X2 according to the first exemplary embodiment of the present invention is bent at a higher speed as compared to the known organic light emitting diode display X1, the defect occurrence ratio is reduced.

A method of manufacturing the organic light emitting diode display according to the first exemplary embodiment of the present invention will be described below in detail with reference to FIGS. 4 to 6.

Figure 4:
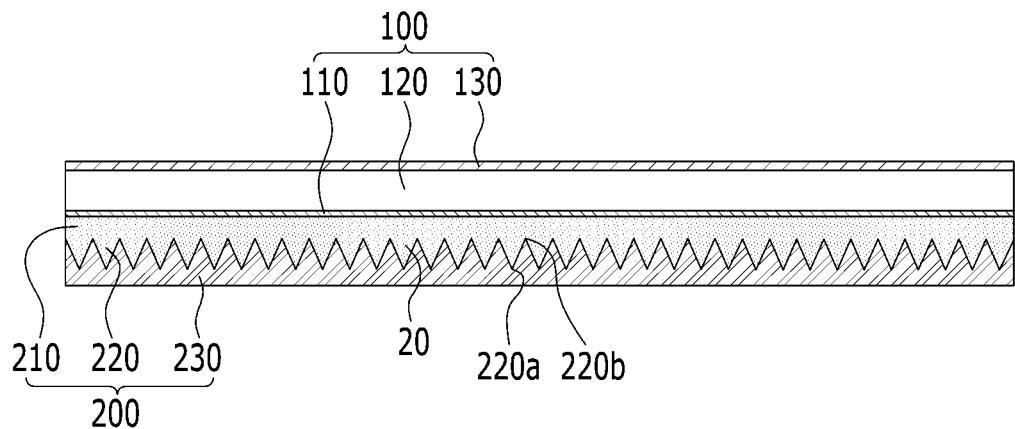
FIGS. 4 to 6 are views sequentially showing a method of manufacturing the organic light emitting diode display according to the first exemplary embodiment of the present invention.
Figure 5:
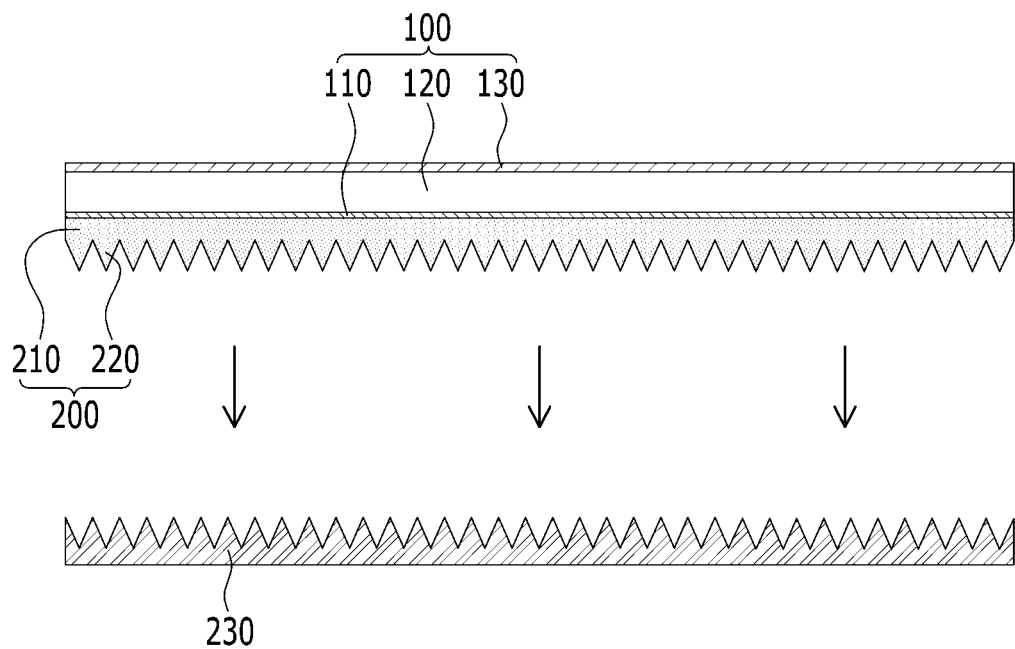
Figure 6:
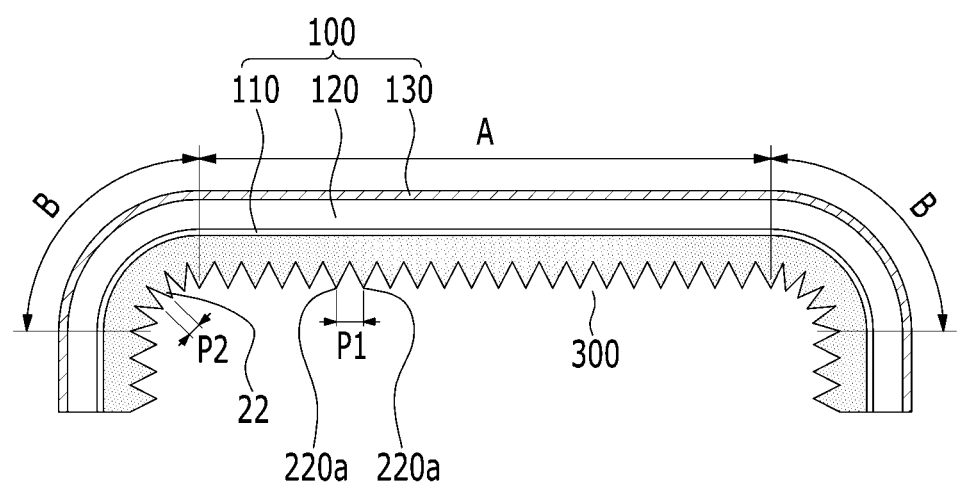

FIGS. 4 to 6 are views sequentially showing a method of manufacturing the organic light emitting diode display according to the first exemplary embodiment of the present invention.

First, as shown in FIG. 4, the lower passivation film 200 is manufactured. The lower passivation film 200 includes the support film 210, the stress adjustment layer 220 formed beneath the support film 210, and the release film 230 covering the stress adjustment layer 220. The stress adjustment layer 220 includes a plurality of stress adjustment patterns 20 disposed to be adjacent to each other.

In addition, the lower passivation film 200 is attached to the bottom of the flexible substrate 110. Also, the organic light emitting element 120 and the thin film encapsulation layer 130 are sequentially formed on the flexible substrate 110 to complete the organic light emitting diode display panel 100.

As described above, the stress adjustment layer 220 is covered with the release film 230 to flatten the lower passivation film 200 while the stress adjustment layer 220 of the lower passivation film is not first exposed, thus completing the organic light emitting diode display panel 100. Thereby, a reduction in recognition ratio of an align mark due to optical scattering by the stress adjustment patterns 20 of the lower passivation film 200 may be prevented during the manufacturing process.

Further, when a chip on film (COF) is pressed onto the organic light emitting diode display panel 100 while the stress adjustment layer 220 of the lower passivation film 200 is exposed, a reduction in pressing force may increase a frequency of occurrence of pressing defects. However, pressing force may be prevented from being reduced, and the frequency of occurrence of pressing defects may thus be reduced, by pressing the chip on film (COF) onto the organic light emitting diode display panel 100 while the stress adjustment layer 220 is covered with the release film 230 to flatten the lower passivation film 200.

Next, as shown in FIG. 5, the release film 230 is separated from the lower passivation film 200 to expose the stress adjustment layer 220. In this case, a space is formed between the adjacent stress adjustment patterns 20 of the stress adjustment layer 220.

Next, as shown in FIG. 6, a portion of the organic light emitting diode display panel 100 is bent to form the bent portion B. In this case, the space between the bending stress adjustment patterns 22 at a position corresponding to the bent portion B is reduced.

Accordingly, the bent interval P2 between the bending stress adjustment patterns 22 corresponding to the bent portion B is smaller than the planar interval P1 between the plane stress adjustment patterns 21 corresponding to the planar portion A of the organic light emitting diode display panel 100. In this case, the planar interval P1 or the bent interval P2 may be an interval between the central axes 220a of adjacent stress adjustment patterns 20.

The lower ends of the adjacent stress adjustment patterns having the triangle shape are directly connected to each other in the first exemplary embodiment. However, other configurations are contemplated, and the lower ends of the adjacent stress adjustment patterns may be spaced apart from each other at a predetermined interval.

Hereinafter, the organic light emitting diode display according to a second exemplary embodiment of the present invention will be described in detail with reference to FIG. 7.

Figure 7:
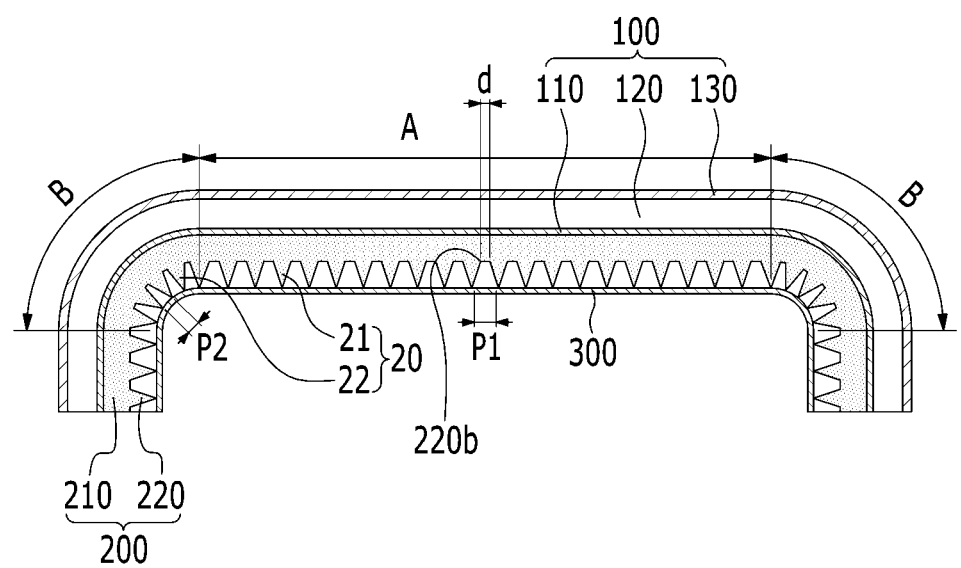
FIG. 7 is a lateral view of the organic light emitting diode display according to a second exemplary embodiment of the present invention.

FIG. 7 is a lateral view of the organic light emitting diode display according to a second exemplary embodiment of the present invention.

The second exemplary embodiment is substantially the same as the first exemplary embodiment shown in FIGS. 1 and 2, with the exception of the interval between the lower ends of the stress adjustment patterns of the lower passivation film, and thus any repetitive description thereof will be omitted.

As shown in FIG. 7, the stress adjustment patterns 20 of the organic light emitting diode display according to the second exemplary embodiment of the present invention have a triangular shape. The lower ends 220b of the adjacent stress adjustment patterns 20 are connected while being spaced apart from each other at a predetermined interval d. In the stress adjustment patterns 20 having the aforementioned shape, stress occurring in the bent portion B may be further minimized.

Meanwhile, the stress adjustment patterns having the triangular shape are formed as in the first exemplary embodiment. However, other shapes are also contemplated. For example, stress adjustment patterns having a trapezoid or other polygonal shape are formed.

Hereinafter, organic light emitting diode displays according to third and the fourth exemplary embodiments of the present invention will be described in detail with reference to FIGS. 8 and 9.

Figure 8:
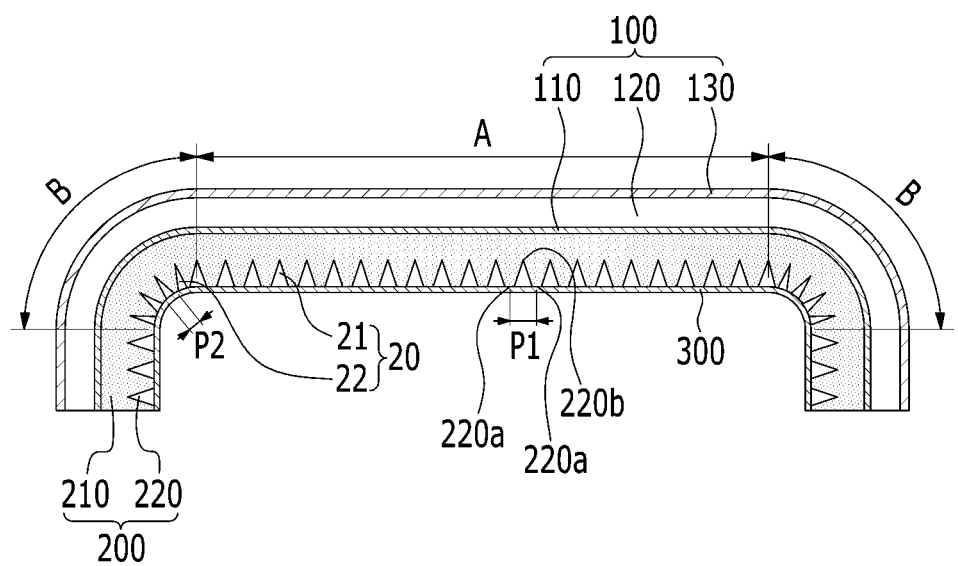
FIG. 8 is a lateral view of the organic light emitting diode display according to a third exemplary embodiment of the present invention.
Figure 9:
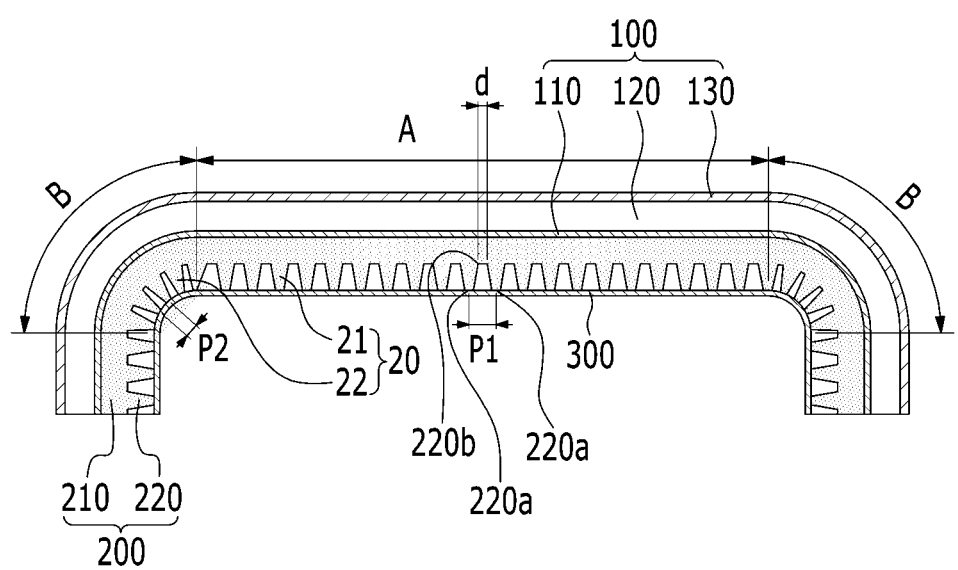
FIG. 9 is a lateral view of the organic light emitting diode display according to a fourth exemplary embodiment of the present invention.

FIG. 8 is a lateral view of an organic light emitting diode display according to a third exemplary embodiment of the present invention, and FIG. 9 is a lateral view of an organic light emitting diode display according to a fourth exemplary embodiment of the present invention.

The third and the fourth exemplary embodiments are substantially the same as the first and the second exemplary embodiments shown in FIGS. 1 and 7, with the exception of the shapes of the stress adjustment patterns of the lower passivation film, and thus any repetitive description thereof will be omitted.

First, as shown in FIG. 8, the stress adjustment patterns 20 of the organic light emitting diode display according to the third exemplary embodiment of the present invention have a trapezoidal shape. The lower ends 220b of the adjacent stress adjustment patterns 20 having the trapezoid shape are directly connected to each other. The intervals P1 and P2 between the stress adjustment patterns 20 having the trapezoidal shape are intervals between the central axes 220a of adjacent trapezoidal shapes.

Further, as shown in FIG. 9, the stress adjustment patterns 20 of the organic light emitting diode display according to the fourth exemplary embodiment of the present invention have a trapezoidal shape. The lower ends 220b of the adjacent trapezoidal stress adjustment patterns 20 are connected while being spaced apart from each other at a predetermined interval d. The intervals P1 and P2 between the stress adjustment patterns 20 having the trapezoid shape are intervals between the central axes 220a of adjacent trapezoidal shapes.

In the stress adjustment patterns 20 having the trapezoidal shapes shown in FIGS. 8 and 9, stress occurring in the bent portion B may be further minimized as compared to the stress adjustment patterns 20 having the triangular shape shown in FIGS. 1 and 7.

Figure 10:
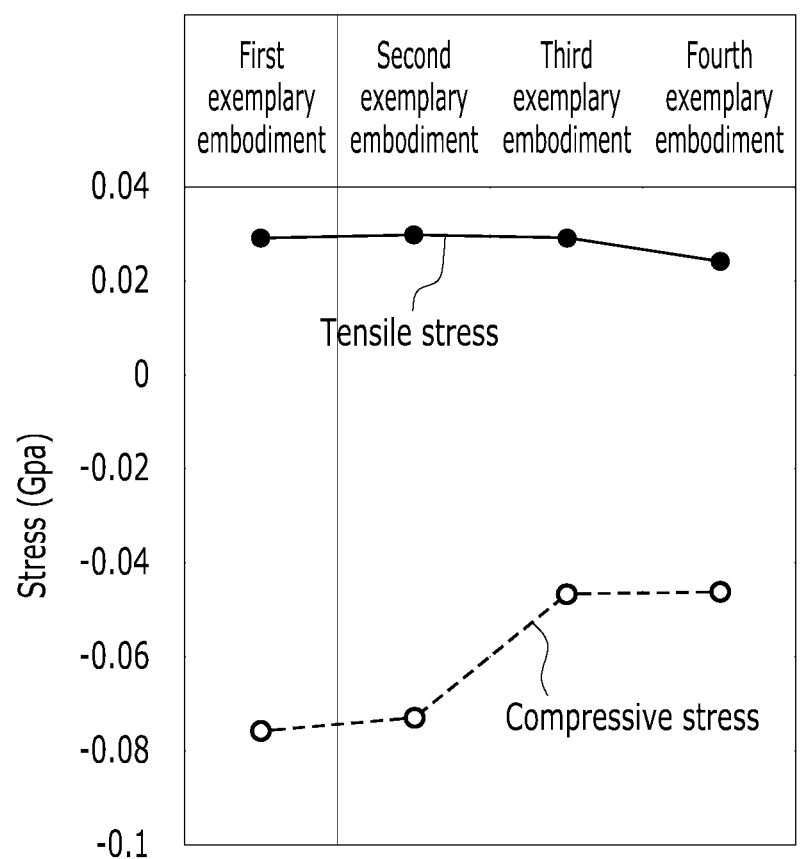
FIG. 10 is a graph showing comparison of stresses of the organic light emitting diode displays according to the first to the fourth exemplary embodiments of the present invention.

FIG. 10 is a graph comparing stresses generated at outer surfaces of organic light emitting diode displays constructed according to the first through fourth exemplary embodiments of the present invention.

As shown in FIG. 10, tensile stress and compressive stress of the third and the fourth exemplary embodiments with trapezoidal stress adjustment patterns are reduced as compared to the first and the second exemplary embodiments with triangular stress adjustment patterns.

Further, it can be seen that tensile stress and compressive stress in the second exemplary embodiment, where the lower ends of the stress adjustment patterns are connected while being spaced apart from each other at a predetermined interval, are reduced as compared to the first exemplary embodiment where the lower ends of the stress adjustment patterns are directly connected. In addition, it can be seen that tensile stress and compressive stress of the fourth exemplary embodiment, where the lower ends of the stress adjustment patterns are connected while being spaced apart from each other at a predetermined interval, are reduced as compared to the third exemplary embodiment where the lower ends of the stress adjustment patterns are directly connected.

The first embodiment utilizes triangular stress adjustment patterns. However, the invention is not limited to this configuration. For example, a fifth exemplary embodiment is feasible, in which stress adjustment patterns having a semicircular shape are utilized.

Hereinafter, the organic light emitting diode display according to this fifth exemplary embodiment of the present invention will be described in detail with reference to FIG. 11.

Figure 11:
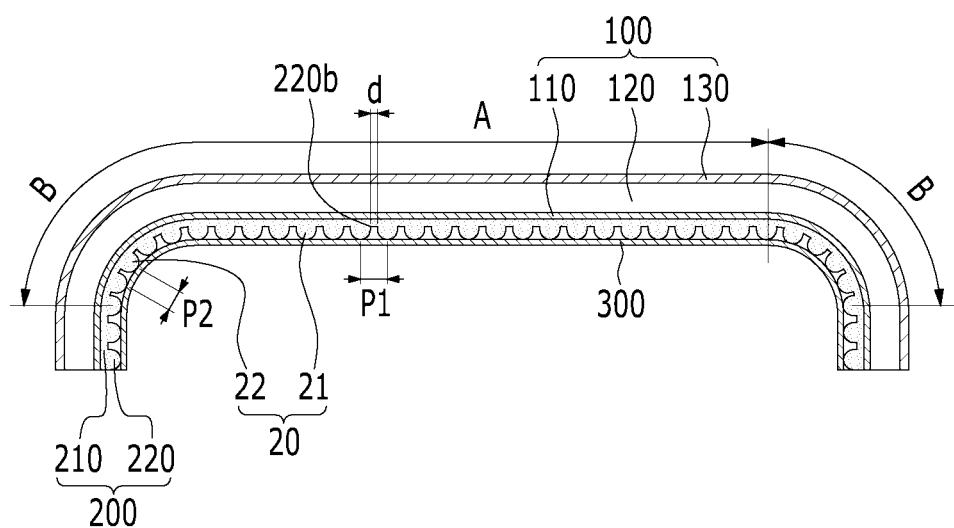
FIG. 11 is a lateral view of the organic light emitting diode display according to a fifth exemplary embodiment of the present invention.

FIG. 11 is a lateral view of an organic light emitting diode display according to the fifth exemplary embodiment of the present invention.

The fifth exemplary embodiment is substantially the same as the first exemplary embodiment shown in FIGS. 1 and 2, with the exception of the shapes of the stress adjustment patterns of the lower passivation film, and thus any repetitive description thereof will be omitted.

As shown in FIG. 11, the stress adjustment patterns 20 of the organic light emitting diode display according to the fifth exemplary embodiment of the present invention have a semicircular shape. The lower ends 220b of adjacent semicircular stress adjustment patterns 20 are connected while being spaced apart from each other at a predetermined interval d. In the stress adjustment patterns 20 having the aforementioned shape, stress occurring in the bent portion B may be further minimized.

Meanwhile, the stress adjustment patterns are formed across the entire lower passivation film in the first exemplary embodiment. However, a sixth exemplary embodiment is also contemplated, in which the stress adjustment patterns are not formed in a portion of the lower passivation film.

Hereinafter, the organic light emitting diode display according to the sixth exemplary embodiment of the present invention will be described in detail with reference to FIG. 12.

Figure 12:
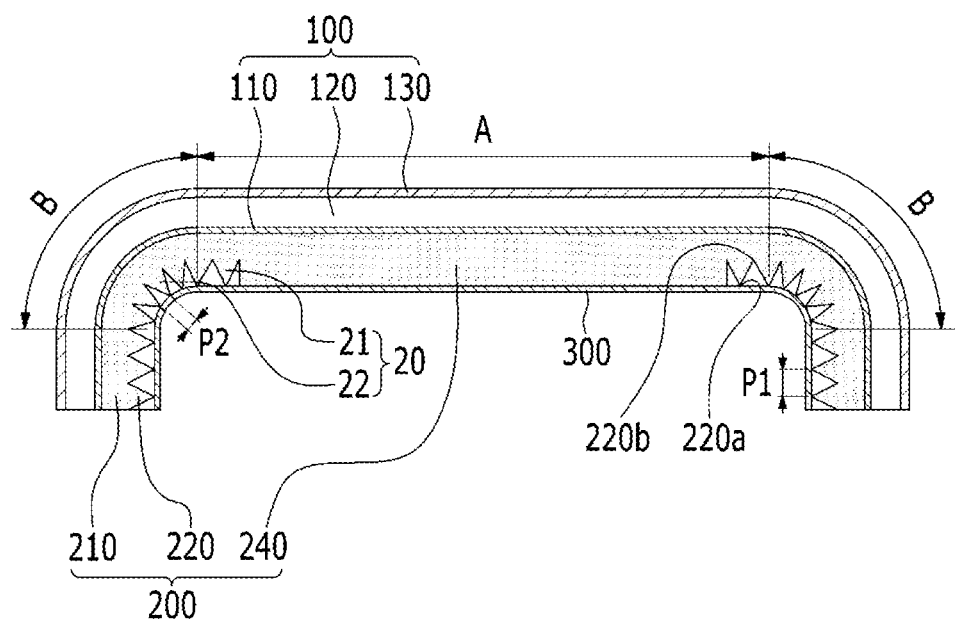
FIG. 12 is a lateral view of the organic light emitting diode display according to a sixth exemplary embodiment of the present invention.

FIG. 12 is a lateral view of the organic light emitting diode display according to the sixth exemplary embodiment of the present invention.

The sixth exemplary embodiment is substantially the same as the first exemplary embodiment shown in FIGS. 1 and 2 with the exception of the stress adjustment patterns of the lower passivation film, and thus any repetitive description thereof will be omitted.

As shown in FIG. 12, the lower passivation film 200 of the organic light emitting diode display according to the sixth exemplary embodiment of the present invention includes the support film 210 that is in contact with the flexible substrate 110 of the organic light emitting diode display panel 100, the stress adjustment layer 220 formed beneath the support film 210, and a plane passivation layer 240 formed beneath the support film 210 and adjacent to the stress adjustment layer 220.

The stress adjustment layer 220 includes a plurality of stress adjustment patterns 20 disposed to be adjacent to each other. The stress adjustment patterns 20 include stress adjustment patterns 21 formed at a position corresponding to the planar portion A, and bent stress adjustment patterns 22 formed at a position corresponding to the bent portions B. The interval between the stress adjustment patterns 20 may be adjusted to adjust a strain of the organic light emitting diode display panel 100, thereby reducing stress in the bent portions B. That is, the bending interval P2 between the bent stress adjustment patterns 22 is formed to be smaller than the interval P1 between the stress adjustment patterns 21.

In this case, the plane passivation layer 240 is formed at most positions corresponding to the planar portion A that are not bent, and the bent stress adjustment pattern 22 is formed only at a position corresponding to the bent portion B. Accordingly, the lower passivation film 200 protecting the organic light emitting diode display panel 100 from the outside may function sufficiently.

Meanwhile, the stress adjustment pattern is formed in the shape of a prism in the first exemplary embodiment, but the stress adjustment pattern according to a seventh exemplary embodiment of the present invention may be formed in the shape of a triangular pyramid.

Figure 13:
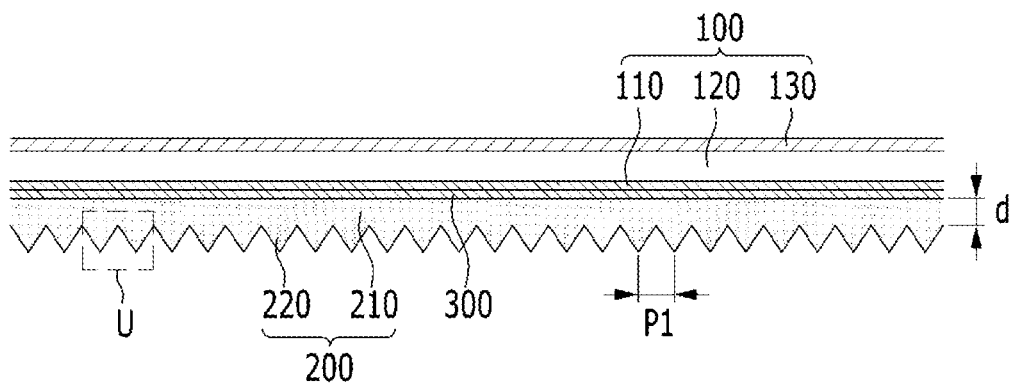
FIG. 13 is a side view of an OLED display according to a seventh exemplary embodiment of the present invention.
Figure 14:
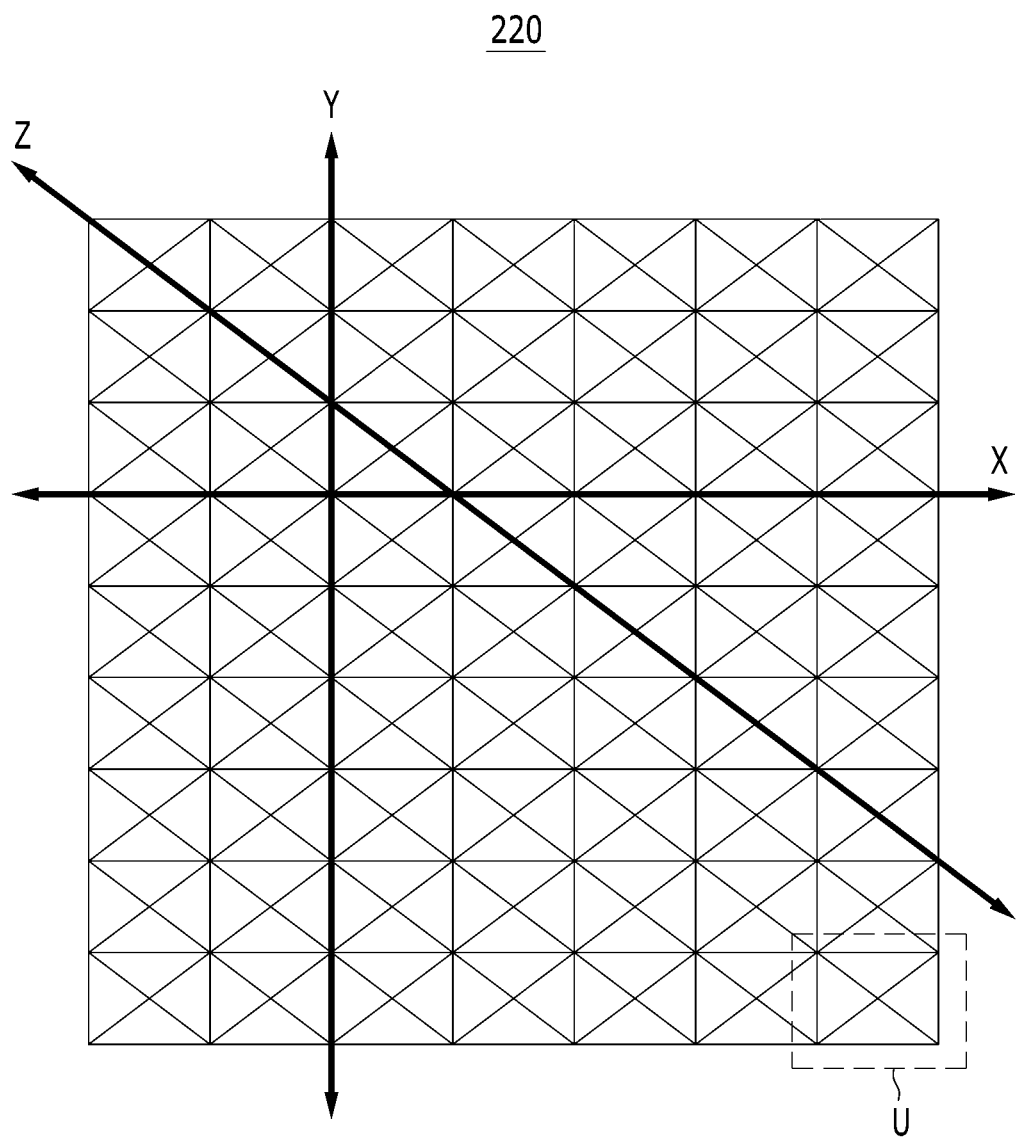
FIG. 14 is a top plan view of a stress adjustment layer of the OLED display according to the seventh exemplary embodiment of the present invention.
Figure 15:
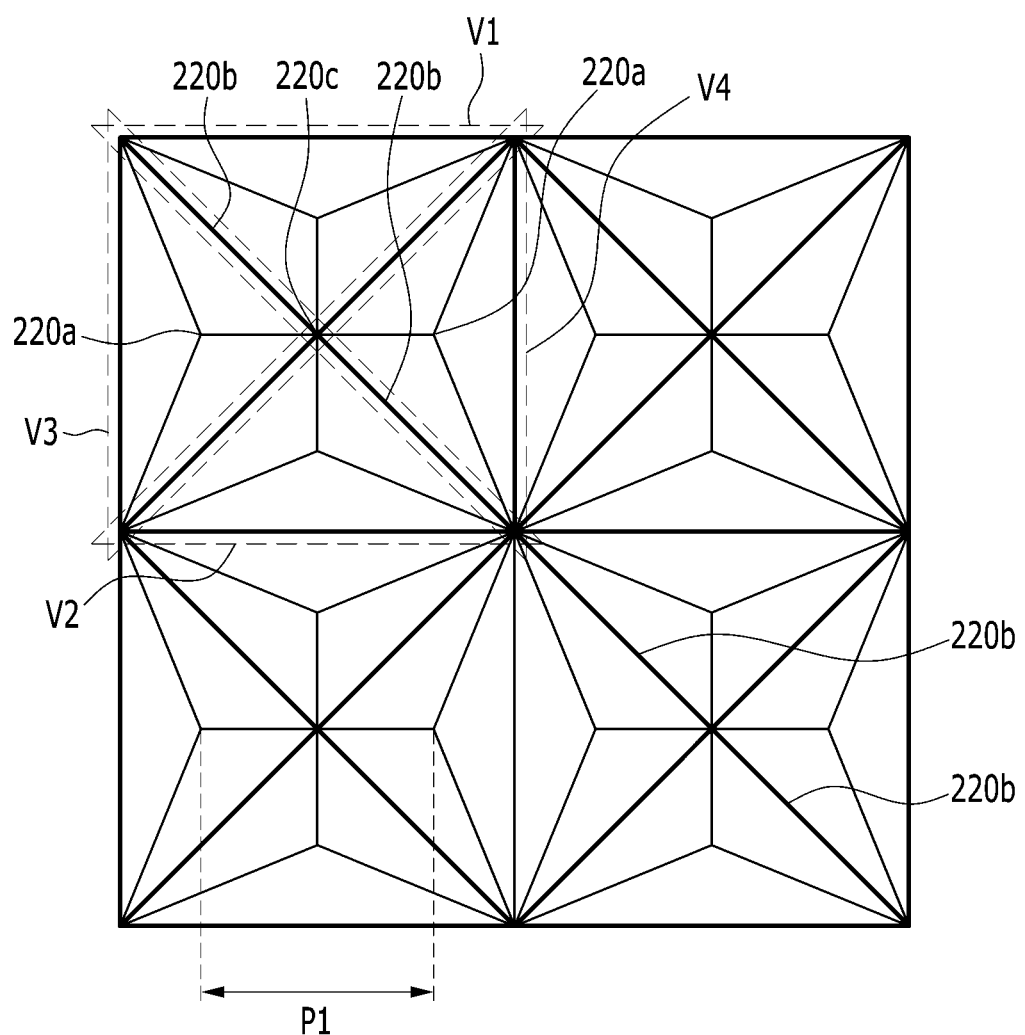
FIG. 15 is an enlarged top plan view of four unit stress adjustment patterns of FIG. 14.
Figure 17:
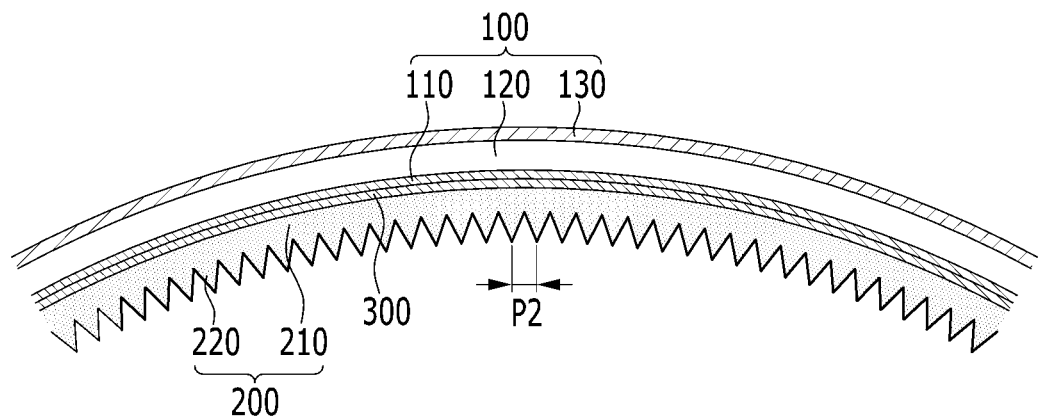
FIG. 17 is a side view illustrating the OLED display in a bent state according to the seventh exemplary embodiment of the present invention.

FIG. 13 is a side view of an OLED display according to a seventh exemplary embodiment of the present invention, FIG. 14 is a top plan view of a stress adjustment layer of the OLED display according to the seventh exemplary embodiment of the present invention, FIG. 15 is an enlarged top plan view of four unit stress adjustment patterns of FIG. 14, and FIG. 17 is a side view illustrating the OLED display in a bent state according to the seventh exemplary embodiment of the present invention.

As shown in FIG. 13, an OLED display according to the seventh exemplary embodiment of the present invention includes an organic light emitting display panel 100, a lower passivation film 200 attached to a bottom of the organic light emitting diode display panel 100, and an adhesive 300 attaching the lower passivation film 200 to the organic light emitting diode display panel 100.

The organic light emitting diode display panel 100 includes a flexible substrate 110, an organic light emitting element 120 formed on the flexible substrate 110, and a thin film encapsulation layer 130 covering the organic light emitting element 120.

The flexible substrate 110 may be formed of a flexible film such as polyimide.

The lower passivation film 200 prevents the flexible substrate from being damaged and eases handling of the organic light emitting diode display panel during manufacture, and may include a material selected from UV epoxys, urethane acrylates, and acrylates.

Such a lower passivation film 200 includes a support film 210 attached to the flexible substrate 110 using an adhesive 300 and a stress adjustment layer 220 formed beneath the support film 210.

The stress adjustment layer 220 includes a plurality of unit stress adjustment patterns U disposed to be adjacent to each other. The unit stress adjustment patterns U are respectively formed in the shape of squares when viewed in plan view, and include four stress adjustment patterns V1, V2, V3, and V4, which are protrusions, each formed in the shape of a triangular pyramid. The four stress adjustment patterns V1, V2, V3, and V4 correspond to an upper stress adjustment pattern V1, a lower stress adjustment pattern V2, a left stress adjustment pattern V3, and a right stress adjustment pattern V4.

The upper stress adjustment pattern V1 and the lower stress adjustment pattern V2 are disposed to be symmetric to each other, and the left stress adjustment pattern V3 and the right stress adjustment pattern V4 are disposed to be symmetric to each other. In this case, bottom edges of stress adjustment patterns V1, V2, V3, and V4 that neighbor each other are directly connected with each other, and a vertex of one of the four triangular pyramid-shaped stress adjustment patterns V1, V2, V3, and V4 is shared. That is, the upper stress adjustment pattern V1, the left stress adjustment pattern V2, the left stress adjustment pattern V3, and the right stress adjustment pattern V4 share a vertex 220c that corresponds to an axis of symmetry.

A portion that corresponds to the triangular pyramid-shaped bottom edge 220b is as thin as a thickness d of the support film 210, and therefore the stress adjustment patterns V1, V2, V3, and V4 can be easily bent along the bottom edges 220b.

Figure 16:
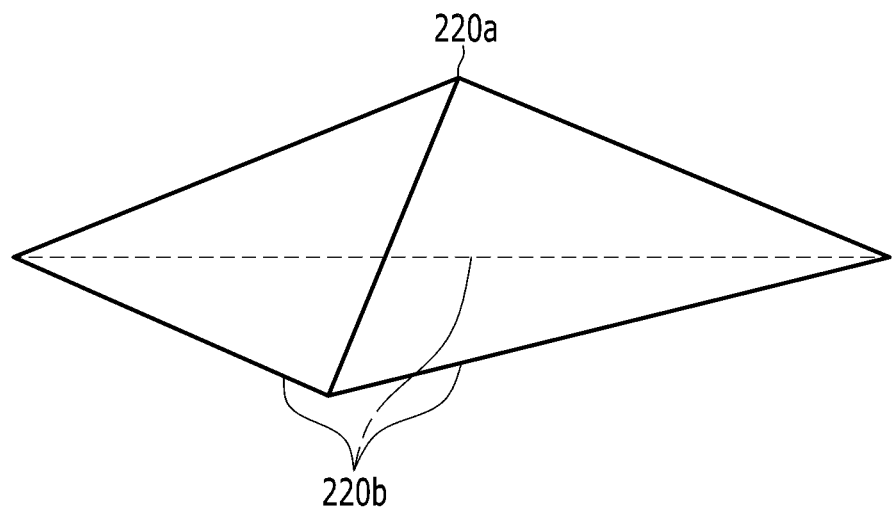
FIG. 16 is an enlarged perspective view of the part V1 of FIG. 15.

As shown in FIG. 14, a unit stress adjustment pattern U formed of the four stress adjustment patterns V1, V2, V3, and V4 is arranged in repeating manner along a horizontal direction X and a vertical direction Y, and it is also arranged in repeating manner along a diagonal direction Z. In this case, as shown in FIG. 16, bottom edges 220b of the stress adjustment patterns V1, V2, V3, and V4 in two unit stress adjustment patterns U that neighbor each other are connected with each other, thereby forming a straight line.

Therefore, the bottom edges 220b of the stress adjustment patterns V1, V2, V3, and V4 are connected to each other along the horizontal direction X, the vertical direction Y, and the diagonal direction Z so that they can be easily bent along the horizontal direction X, the vertical direction Y, and/or the diagonal direction Z.

Thus, as shown in FIG. 13 and FIG. 17, in the OLED display according to the exemplary embodiment of the present invention, a bent gap P2 between upper vertexes 220a of the stress adjustment patterns V1, V2, V3, and V4 in a bent state becomes smaller than a planar gap P1 between upper vertexes 220a of the stress adjustment patterns in a planar state.

As described, the stress adjustment layer 220 can be easily bent along the horizontal direction X, the vertical direction Y, and the diagonal direction Z by forming the stress adjustment layer 220 having triangular pyramid-shaped stress adjustment patterns V1, V2, V3, and V4, and therefore a stress generated in the organic light emitting diode display panel 100 when the organic light emitting diode display panel 100 is being bent can be minimized. Accordingly, when the organic light emitting diode display panel is bent, asymmetry in a strain of the organic light emitting diode display panel can be prevented, thereby preventing abnormality in the screen.

While this invention has been described in connection with what is presently considered to be practical exemplary embodiments, it is to be understood that the invention is not limited to the disclosed embodiments, but, on the contrary, is intended to cover various modifications and equivalent arrangements included within the scope of the appended claims, detailed description of the invention, and drawings. Additionally, various features of the above described embodiments may be mixed and matched in any combinations so as to produce further embodiments.

<Description of symbols>

| | |
|---|---|
| 100: organic light emitting display panel | 200: lower passivation film |
| 210: support film | 220: stress adjustment layer |
| 240: plane passivation layer | |

What is claimed is:

1. An organic light emitting diode display comprising:
   an organic light emitting display panel configured to display an image, and
   a lower passivation film attached to a bottom of the organic light emitting diode display panel,
   wherein the lower passivation film includes:
      a support film that is in contact with the organic light emitting diode display panel, and
      a stress adjustment layer formed beneath the support film and configured to reduce a bending stress to be induced in the organic light emitting display panel when the organic light emitting display panel and the lower passivation film are bent, wherein the organic light emitting diode display panel includes a flat portion and a bent portion.

2. The organic light emitting diode display of claim 1, wherein the stress adjustment layer includes a plurality of stress adjustment patterns disposed adjacent to each other.

3. The organic light emitting diode display of claim 2, wherein the stress adjustment patterns have any one selected from a triangular shape, a trapezoidal shape, and a semicircular shape.

4. The organic light emitting diode display of claim 3, wherein lower ends of adjacent stress adjustment patterns are directly connected.

5. The organic light emitting diode display of claim 3, wherein lower ends of adjacent stress adjustment patterns are spaced apart from each other.

6. The organic light emitting diode display of claim 2, wherein the bent portion is positioned at an end of the flat portion.

7. The organic light emitting diode display of claim 6, wherein:
   the stress adjustment patterns include first stress adjustment patterns positioned corresponding to the flat portion and second stress adjustment patterns positioned corresponding to the bent portions, and
   an interval between the second stress adjustment patterns is smaller than an interval between the first stress adjustment patterns.

8. The organic light emitting diode display of claim 7, wherein the interval between the first stress adjustment patterns and the interval between the second stress adjustment patterns are intervals between central axes of upper ends of the first and second stress adjustment patterns, respectively.

9. The organic light emitting diode display of claim 6, wherein the lower passivation film further includes a plane passivation layer formed beneath the support film and adjacent to the stress adjustment layer.

10. The organic light emitting diode display of claim 9, wherein the plane passivation layer is positioned to correspond to the flat portion.

11. The organic light emitting diode display of claim 1, wherein the organic light emitting diode display panel includes:
   a flexible substrate attached to a top of the lower passivation film,
   an organic light emitting element formed on the flexible substrate, and
   a thin film encapsulation layer covering the organic light emitting element.

12. An organic light emitting diode (OLED) display comprising
   an organic light emitting display panel configured to display an image and including a flat portion and a bent portion; and
   a lower passivation film attached to a bottom of the organic light emitting diode display panel,
   wherein the lower passivation film comprises:
      a support film contacting the organic light emitting diode display panel, and
      a stress adjustment layer formed beneath the support film, wherein
      the stress adjustment layer comprises a plurality of unit stress adjustment patterns, each having a quadrilateral base and arranged adjacent to each other.

13. The OLED display of claim 12, wherein the unit stress adjustment patterns each comprise four stress adjustment patterns positioned adjacent to each other and having pyramidal shapes.

14. The OLED display of claim 13, wherein the four stress adjustment patterns of each unit stress adjustment pattern intersect at a common point.

15. The OLED display of claim 13, wherein the unit stress adjustment patterns are arranged in repeating manner along each of a horizontal direction, a vertical direction, and a diagonal direction.

16. The OLED display of claim 15, wherein bottom edges of two unit stress adjustment patterns positioned adjacent to each other along a diagonal direction are connected to each other.

17. The OLED display of claim 12, wherein the organic light emitting diode display panel comprises:
   a flexible substrate attached on the lower passivation film;
   an organic light emitting element formed on the flexible substrate; and
   a thin film encapsulation layer covering the organic light emitting element.

* * * * *